United States Patent [19]
Park

[11] Patent Number: 6,091,393
[45] Date of Patent: Jul. 18, 2000

[54] SCAN DRIVER IC FOR A LIQUID CRYSTAL DISPLAY

[75] Inventor: Ki Pan Park, Seoul, Rep. of Korea

[73] Assignee: LG Electronics Inc., Seoul, Rep. of Korea

[21] Appl. No.: 08/997,303

[22] Filed: Dec. 23, 1997

[30] Foreign Application Priority Data

Jan. 8, 1997 [KR] Rep. of Korea ...................... 97-00294

[51] Int. Cl.[7] .............................. G09G 3/36; G09G 5/00
[52] U.S. Cl. .......................... 345/100; 345/197; 345/198
[58] Field of Search ..................... 345/100, 197, 345/198

[56] References Cited

U.S. PATENT DOCUMENTS

| | | | |
|---|---|---|---|
| 5,313,222 | 5/1994 | Lee | 345/58 |
| 5,510,805 | 4/1996 | Lee | 345/58 |
| 5,585,815 | 12/1996 | Nakashima et al. | 345/100 |
| 5,619,223 | 4/1997 | Lee et al. | 345/93 |
| 5,648,790 | 7/1997 | Lee | 345/58 |
| 5,701,136 | 12/1997 | Huq et al. | 345/100 |
| 5,710,571 | 1/1998 | Kuo | 345/94 |
| 5,796,390 | 8/1998 | Dupont et al. | 345/204 |

*Primary Examiner*—Richard A. Hjerpe
*Assistant Examiner*—Benjamin D. Bowers
*Attorney, Agent, or Firm*—Morgan, Lewis & Bockius LLP

[57] ABSTRACT

A liquid crystal display device is provided which includes a substrate, a plurality of scan lines on the substrate and a scan driver IC on the substrate. The scan driver IC includes a plurality of scan line selectors, each scan line selector including a first input terminal for receiving a set signal, a second input terminal for receiving a scan reset signal, a shift input terminal for receiving a shift signal, a shift reset terminal for receiving a shift reset signal, a first output terminal connected respectively to one of the plurality of scan lines for outputting a scan line selection signal in accordance with the set signal and the scan reset signal, and a shift output terminal for outputting a shift signal in accordance with the set signal and the shift reset signal.

14 Claims, 10 Drawing Sheets

SCAN DRIVER IC FOR A LIQUID CRYSTAL DISPLAY

This application claims the benefit of Korean Application No. 97-00294, filed in Korea on Jan. 8, 1997, which is hereby incorporated by reference.

BACKGROUND OF THE INVENTION

1. Field of the Invention

The present invention relates to a liquid crystal display device, and more particularly, to the structure of a scan driver IC to be incorporated into the liquid crystal display device.

2. Discussion of the Related Art

The cathode ray tube (CRT) is the most widely used display device in a television set or a computer monitor, because the CRT can easily reproduce full color images at a high response speed. However, the CRT is bulky, heavy, and requires a high supply of power, making portable implementations difficult. Research and development in recent years has led to display alternatives to overcome these disadvantages of the CRT. Among these alternatives is the liquid crystal display (LCD).

The LCD can be applied to a thin television set, such as those used for mounting on the wall. This is because the LCD does not employ an electron gun as the CRT does. Furthermore, the LCD can be applied to a portable display device such as a note-book computer, because the power consumption of an LCD is low enough to be driven by a battery.

As shown in FIG. 1, the LCD device includes a liquid crystal panel, a scan driver 15, and a data driver 14. The liquid crystal panel includes a matrix array of a plurality of scan lines 10 and a plurality of data lines 11. At the intersections of the scan lines 10 and data lines 11, switching elements, such as thin film transistor (TFT) 12, are formed. At a rectangular area surrounded by two neighboring scan lines and two neighboring data lines, a pixel electrode is formed to be connected to the TFT 12. The scan driver 15 applies scan signals, which are either ON or OFF signals, to the gates of the respective TFTs 12 through the scan lines sequentially. The data driver 14 applies data signals to the data lines in order to send the image data to pixel electrodes 13 through the TFTs 12 driven by the scan signal.

According to the conventional art, as shown FIG. 2, the scan driver 15 includes a plurality of odd row selectors and a plurality of even row selectors connected in series. The odd row selector includes an M2 transistor having a gate connected to an SIn terminal, to which a shift input signal is applied. The M2 transistor also has a drain connected to a first common voltage Vss1. An M1 transistor has a gate connected to an S1o terminal, to which a first clock signal is applied. The M1 transistor also has a source connected to a high voltage signal Vcc and a drain connected to the source of the M2 transistor. An M4 transistor has a gate connected to the SIn terminal and a source connected to an S2o terminal, to which a second clock signal is applied. The M3, M5 and M7 transistors each have gates connected to a node a2, which connects the drain of the M1 transistor and the source of the M2 transistor. An M6 transistor has a gate connected to the drain of the M4 transistor and a source connected to a third clock signal S3o. An M11 transistor has a gate connected to the SIn terminal and a source connected to the Vss1 common voltage. An M9 transistor has a gate connected to a fourth clock signal S4, the clock speed of which is twice that of S1o. The M9 transistor also has a source connected to the next scan line. An M10 transistor has a gate connected to the drain of the M9 transistor and a source connected to the drain of the M11 transistor. An M8 transistor has a gate connected to a node d2, which is connected to the source of the M10 transistor and the drain of the M11 transistor. The M8 transistor also has a drain connected to the source of the M7 transistor and the drain of the M6 transistor, as well as a source connected to the drain of the M7 transistor and a second common voltage Vss.

The even selector includes an M2 transistor having a gate connected to an SIn+1 terminal, to which a shift input signal is applied. The M2 transistor also has a drain connected to the first common voltage Vss1. An M1 transistor has a gate connected to an S1e terminal, to which a first clock signal is applied. The M1 transistor also has a source connected to the high signal voltage Vcc, as well as a drain connected to the source of the M2 transistor. An M4 transistor has a gate connected to the SIn+1 terminal and a source connected to an S2e terminal, to which a second clock signal is applied. The M3, M5 and M7 transistors each have gates connected to a node a3, which connects the drain of the M1 transistor and the source of the M2 transistor. An M6 transistor has a gate connected to the drain of the M4 transistor and a source connected to a third clock signal S3e. An M11 transistor has a gate connected to the SIn+1 terminal and a source connected to the common voltage Vss1. An M9 transistor has a gate connected to a fourth clock signal S4, the clock speed of which is twice that of the S1e clock signal. The M9 transistor also has a source connected to the next row (scan line). An M10 transistor has a gate connected to the drain of the M9 transistor and a source connected to the drain of the M11 transistor. An M8 transistor has a gate connected to a node d3, which connects the source of the M10 transistor and the drain of the M11 transistor. The M8 transistor also has a drain connected to the source of the M7 transistor and the drain of the M6 transistor. The M8 transistor has a source connected to the drain of the M7 transistor and the second common voltage Vss.

Here, the clock speeds of the three clock signals applied to the odd row selector, S1o, S2o, and S3o, and the three clock signals applied to the even row selector, S1e, S2e, and S3e, are half of that of the horizontal sync signal. The clock signals applied to the odd row selector have a "HIGH" pulse when the clock signals applied to the even row selector have a "LOW" pulse and vice versa. Moreover, the clock signal S4 has the same cycle as the horizontal sync signal. Because of this, the odd row selector sends the scan signal generated by the S1o, S2o, S3o, and SIn signals to the scan line connected thereto. The even row selector sends the scan signal generated by the S1e, S2e, S3e, and SIn+1 signals to the scan line connected thereto. When the nth row selector sends a scan signal to the nth scan line, the scan signal is sent to the next row selector as a shift signal. If the nth row selector is an odd row selector, the shift signal is sent to the SIn+1 terminal of the next (even) row selector. An initial shift signal is applied to the first row selector.

The operation of the scan driver will be explained with reference to circuit diagram FIG. 2 and clock signal diagram FIG. 3. Assume that the first row selector shown in FIG. 2 is an odd row selector, and the initial shift signal of a "HIGH" state for selecting the first scan line is applied to the SIn terminal at time t2. As a result, the M2 and M4 transistors are turned on at time t2. When the S1o and S2o terminals are in a "LOW" state, the sources and drains of the M2 and M4 transistors are not provided with any "HIGH" signals. In this condition, the M3, M5 and M7 transistors are not turned on. Since the source of the M4 transistor is not provided with a "HIGH" signal, the M6 transistor is not turned on.

After a "HIGH" signal is applied to SIn, if the clock signal S1o generated by the horizontal sync signal is "HIGH", then the M1 transistor is turned on at time t3 (FIG. 3). As a result, the M3, M5 and M7 transistors are all turned on. These transistors are connected to the node a2 connecting the M1 and M2 transistors. However, the M5 transistor is not supplied with a "HIGH" signal, because the M4 transistor is not provided with a "HIGH" signal (S2o is "LOW"). Moreover, the M7 transistor is not supplied with a "HIGH" voltage, because the M6 transistor is not turned on.

Before the S1o clock signal changes to "LOW", the S2o clock signal becomes "HIGH" at time t4. Then, the M6 transistor is turned on by the signal of the M4 transistor through node b2 at time t4. At that time, the S2o voltage coming through the M5 transistor reaches the M11 transistor turned on by the SIn signal and turns on the M8 transistor.

When the S1o signal becomes "LOW" at time t5, the M1 transistor is turned off and the M5 and M7 transistors, of which gates are connected to the node a2, are also turned off at time t5. While S1o is "LOW" and S2o is "HIGH", S3o becomes "HIGH" at time t6. At that time, the M6 transistor is turned on by the clock signal S2o, and the clock signal S3o is applied to the first scan line connected to the Rn terminal (signal r1 in FIG. 3).

At the same time, the S3o clock signal is applied to the SIn+1 terminal of the next (second) row selector for terminal Rn+1 as a shift signal. When the S1e of the second row selector becomes "HIGH" at time t7, the SIn becomes "LOW". At that time, the M2, M4 and M11 transistors in the first row selector are turned off and the second row selector starts working in a similar manner to the first row selector, as described above.

In manufacturing a conventional LCD device, the liquid crystal panel and the driving ICs are separately manufactured and assembled using a lead wire of lead film. In recent years, there is a need for manufacturing the driving ICs directly on the liquid crystal panel. However, the conventional structure of the driving circuit is too complicated and includes too many lead lines to allow manufacturing of the driving circuit directly on the liquid crystal panel.

Moreover, the clock signal's converting timing to a "HIGH" signal lags behind the horizontal sync signal's converting timing to a "HIGH" signal in the conventional arrangement. If the transistor used in the driving IC is formed of an amorphous silicon having a slow response time in character, a need arises to guarantee the sufficient response time for the driving IC. Consequently, it is necessary to moderate or adjust the signals used to drive the devices according to characteristics of the materials making up the driving ICs. If the driving ICs are made of polysilicon, which has a faster response time, it is difficult to precisely control the driver ICs.

Furthermore, according to the wave shape of the clock signals S1, S2, and S3, their "HIGH" states are overlapped with each other. The "HIGH" state of the S3 signal causes unpredicted influences to the shift signal. This is because most of the TFTs are simultaneously turned on when a scan line is selected. This results in a higher load in the circuit of the driving ICs.

Therefore, a manufacturing method by which a simpler scan driver IC can be integrally manufactured on the same substrate as the TFT array is desired. Applicant has a patent application number P97-00293 pending in the Korea Industry Properties Office. This Korean application has a corresponding U.S. patent application to the same inventor (Attorney docket number 043695-5019). These applications describe a scan driver composed of a plurality of row selectors, each including, as shown in FIG. 4, a D input terminal for receiving a shift signal; a CU input terminal for receiving a set signal; a CD input terminal for a reset signal; an M1 transistor having a gate connected to the CU terminal and a source connected to the D terminal; an M2 transistor having a source connected the drain of the M1 transistor; a gate connected to the CD terminal, and a drain connected to a common voltage Vss; an M3 transistor having a gate connected to the CD terminal and a source connected to a high signal voltage Vcc; an M4 transistor having a gate connected to the CU input terminal, a source connected to the drain of the M3 transistor, and a drain connected to the common voltage Vss; an M5 transistor having a gate connected to a node "a" connecting the drain of the M1 and the source of the M2, and a source connected to Vcc; an M6 transistor having a gate connected to a node "b" connecting the drain of the M3 transistor and the source of the M4 transistor, a source connected to the drain of the M5 transistor, and a drain connected to Vss; a first capacitor Ch having an electrode connected to a node "c" connecting the node "a" and the gate of the M5 transistor and another electrode connected to the common electrode Vss; a second capacitor Cs having an electrode connected to a node "d" connecting the node "b" and the gate of the M6 transistor and another electrode connected to the common voltage Vss; and an output terminal R connected to a node "e" connecting the drain of the M5 transistor and the source of the M6 transistor.

The scan driving IC includes a plurality of the row selectors described above serially connected. The output terminal R is connected to the D terminal of the next row selector, as shown in FIG. 5. The odd row selectors are provided with set signals from the CK1 clock signal, and reset signals from the CK2 clock signal. The even row selectors are provided with the set signals from the CK3 clock signal and the reset signals from the CK4 clock signal. The input terminal for the shift signal of the first row selector is supplied with a start pulse CKs.

The waveforms of the CK1, CK2, CK3, and CK4 signals have the same cycle, as shown in FIG. 6, and follow a rule as follows. After the CK1 signal has pulsed once and before the CK1 rises to a "HIGH" level again, the CK2 signal has one pulse. After the CK1 signal goes from "HIGH" to "LOW" and before the CK2 becomes "HIGH" again, the CK3 has one pulse. After the CK3 goes from "HIGH" to "LOW" and before the CK3 becomes "HIGH" again, the CK4 has one pulse.

Referring to the structure of the driving IC, shown in FIGS. 4 and 5 and the waveforms of FIG. 6, operation of this scan driving IC will be described. At the first row selector, during the ON ("HIGH") signal of the CKs applied to the shift terminal, the M1 and M4 transistors are turned on because of the ON ("HIGH") signal from the CK1 clock signal. When the M2 transistor is not turned on, the CKs signal is sent to the gate of the M5 transistor through the node "a". Therefore the M5 transistor is turned on. The CKs signal ("HIGH")is also stored at the capacitor Ch located between the gate of the M5 and the node "a". At this point, the M6 transistor is not turned on. Thus, Vcc is applied to the Ro terminal through the M5 transistor. Hence, the first scan line R1 is selected.

When the CK1 becomes "LOW", the M1 transistor is turned off. Then, the Ch capacitor is no longer supplied with a "HIGH" signal and the Ch capacitor begins discharging. However, the M1 and the M2 transistors are turned off, and thus the discharged signal is supplied to the gate of the M5 transistor. Therefore, the M5 transistor is still being turned on and a "HIGH" signal is applied to the Ro terminal in spite of the CK1 signal being "LOW".

The CK3 signal becomes "HIGH" before the CK2 signal becomes "HIGH". At that time, the output terminal Ro of the first row selector has a "HIGH" signal and the "HIGH" signal is applied to the De terminal of the second row selector. The source of the M1 transistor of the second selector, which is turned on by the CK3 signal, is provided with the "HIGH" signal of the Ro terminal, and accordingly, the M5 transistor of the second selector is turned on. Thus, a "HIGH" signal is applied to the Re terminal of the second row selector. This results in the second scan line R2 being selected. That is, the Ro terminal of the first row selector provides the shift signal to the De terminal of the second row selector while the CK3 signal is in a "HIGH" state. Similarly, the "HIGH" signal of the Re terminal of the second row selector is a shift signal of the Do terminal of the third row selector. Even when the CK3 signal is "LOW", the stored shift signal at the capacitor Ch of the second selector turns on the M5 transistor. Thus, the Re terminal of the second row selector remains in the "HIGH" state.

The CK2 signal becomes "HIGH" after the CK3 signal becomes "LOW". At that time, the M2 transistor and the M3 transistor of the first row selector are turned on. Thus, the discharging signal voltage from the capacitor Ch is no longer applied to the gate of the M5 transistor of the first row selector and, the M5 transistor of the first row selector is turned off. At the same time, in the first row selector, the Vcc is applied to the gate of the M6 transistor and to the Cs capacitor through the M3 transistor. As a result, the M6 transistor is turned on and the common voltage Vss is applied to the output terminal Ro. Therefore, the Ro terminal of the first row selector becomes "LOW". That is, the first scan line R1 is unselected. The M6 transistor is still turned on even when the CK2 signal becomes "LOW", because the M2 and the M3 transistors are turned off and the "HIGH" signal stored at the Cs capacitor is discharged to the gate of the M6 transistor of the first row selector.

The second "HIGH" level of the CK1 signal is applied before the CK4 signal is "HIGH". At that time, the "HIGH" signal of the Re terminal of the second row selector is applied to the Do terminal of the third row selector. As a result, the M1 transistor of the third row selector is turned on by the "HIGH" level of the CK1 signal, and the M5 transistor is turned on by the "HIGH" level of the Do terminal through the M1 transistor. Therefore, the "HIGH" signal is supplied to the Ro terminal of the third row selector. That is, the third scan line is selected. The "HIGH" signal of the Re terminal of the second row selector is a shift signal of the third row selector while the CK1 signal is in a "HIGH" state. Similarly, the "HIGH" signal of the Ro terminal of the third row selector is a shift signal for the fourth row selector, while the CK3 signal is in a "HIGH" state.

The CK4 signal is "HIGH" after the CK1 signal is "LOW". At that time, the M2 and M3 transistors of the second row selector are turned on. As a result, the discharging voltage from the Ch capacitor passes through the M2 transistor, not being applied to the gate of the M5 transistor. Therefore, the M5 transistor is turned off. At the same time, the M6 transistor is turned on, because the Vcc is applied to the M6 transistor and the Cs capacitor through the M3 transistor. As a result, the common voltage Vss is applied to the Re terminal of the second row selector. That is, the second scan line is unselected. When the CK4 signal becomes "LOW", the M6 transistor is still turned on, because the M2 and M3 transistors are turned off and the stored voltage at the Cs capacitor is applied to the gate of the M6 transistor of the second row selector. Therefore, the Re terminal of the second row selector maintains its "LOW" state.

In this embodiment of the applicant's invention above, the high state of the scan selection signal of one row selector overlaps the high state of the scan selection signal of the next row selector, as in the case of the conventional driving Ics, as shown in FIGS. 3 and 6. This results in a problem in applying the data voltage to the pixel electrode. This LCD incorporated with a scan driver IC should utilize an inversion method, such as the dot inversion method or the line inversion method. However, the driving signal of a row selector is overlapped with the shift signal of the next row selector. As a result, the scan selection signal of a row selector is applied to the next row. Therefore, the pixels connected to the next row are applied with an excess voltage during the overlapping period, so the pixels receive electrical stresses. In order to solve this problem, a frame inversion method may be adapted. However, the frame inversion method results in a lower quality display than the dot or line inversion method as a result of cross talk or flicker.

SUMMARY OF THE INVENTION

Accordingly, the present invention is directed to a liquid crystal display that substantially obviates the problems due to limitations and disadvantages of the related art.

An object of the present invention is to provide an improved liquid crystal display device including a scan driver IC which has a reduced number of input and output terminals in the scan driver IC.

Another object of the present invention is to provide a liquid crystal display scan driver suitable for eliminating electrical stresses at pixels.

Another object of the present invention is to provide a driving IC which can be manufactured integrally with the TFT array on the same liquid crystal panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the liquid crystal display device includes a substrate; a plurality of scan lines on the substrate; and a scan driver IC on the substrate having a plurality of scan line selectors, each scan line selector including a first input terminal for receiving a set signal, a second input terminal for receiving a reset signal, a shift input terminal for receiving a shift signal, a shift reset terminal for receiving a shift reset signal, a first output terminal, connected respectively to one of the plurality of scan lines, for outputting a scan line selection signal according to the set signal and the reset signal, and a shift output terminal for outputting a shift signal.

In another aspect of the present invention, a scan driver IC having a plurality of scan line selectors is provided where each of the scan line selectors includes a first input terminal for receiving a set signal; a second input terminal for receiving a reset signal; a shift input terminal for receiving a shift signal; a shift reset terminal for receiving a shift reset signal; an output terminal for outputting a scan line selection signal generated by the set signal and the reset signal; and a shift output terminal for outputting a shift signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

First Preferred Embodiment

Figure 1:
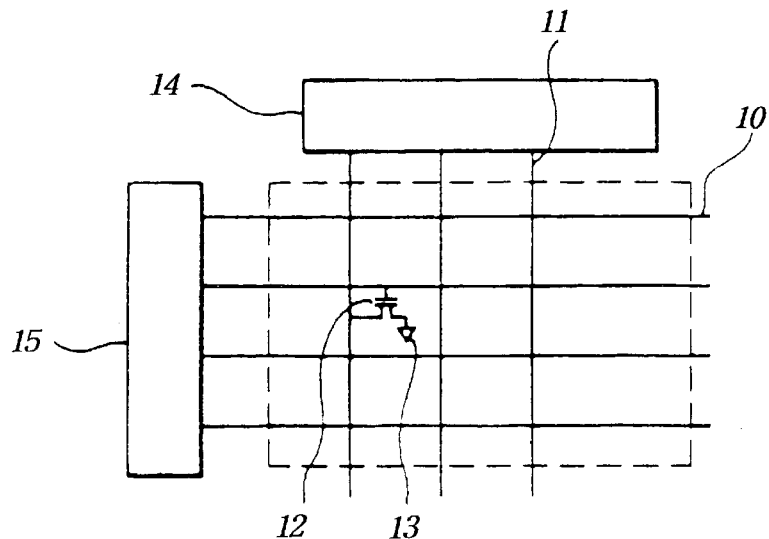
FIG. 1 shows the structure of a liquid crystal panel, a scan driver IC, and a data driver IC in a conventional liquid crystal display device.
Figure 2:
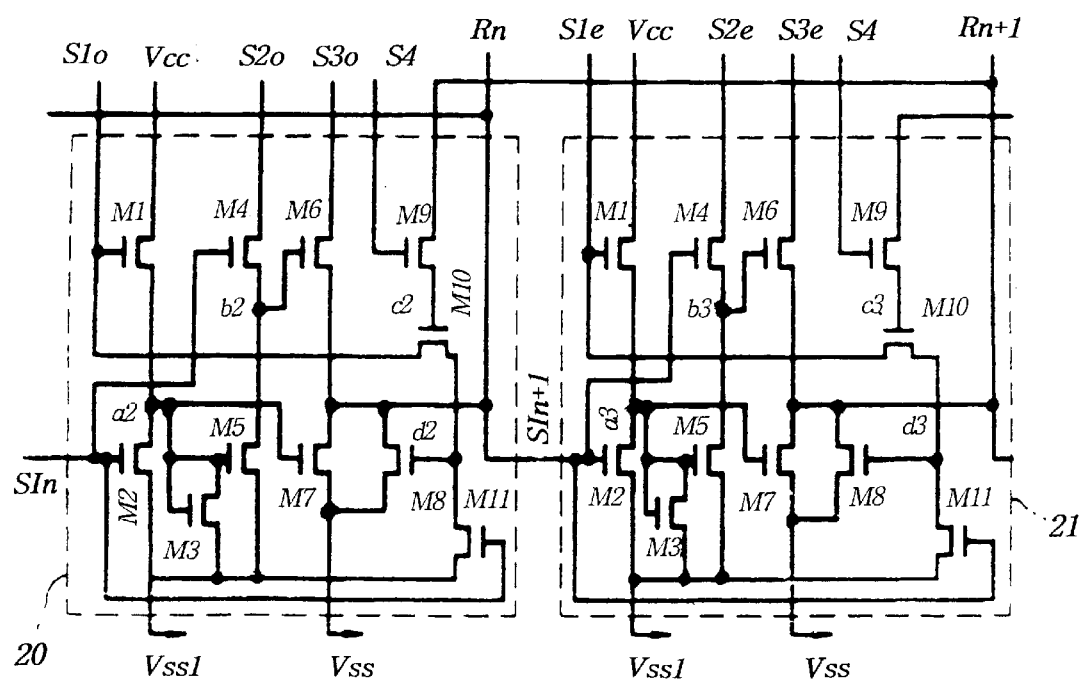
FIG. 2 shows the structure of the scan driver IC of FIG. 1.
Figure 3:
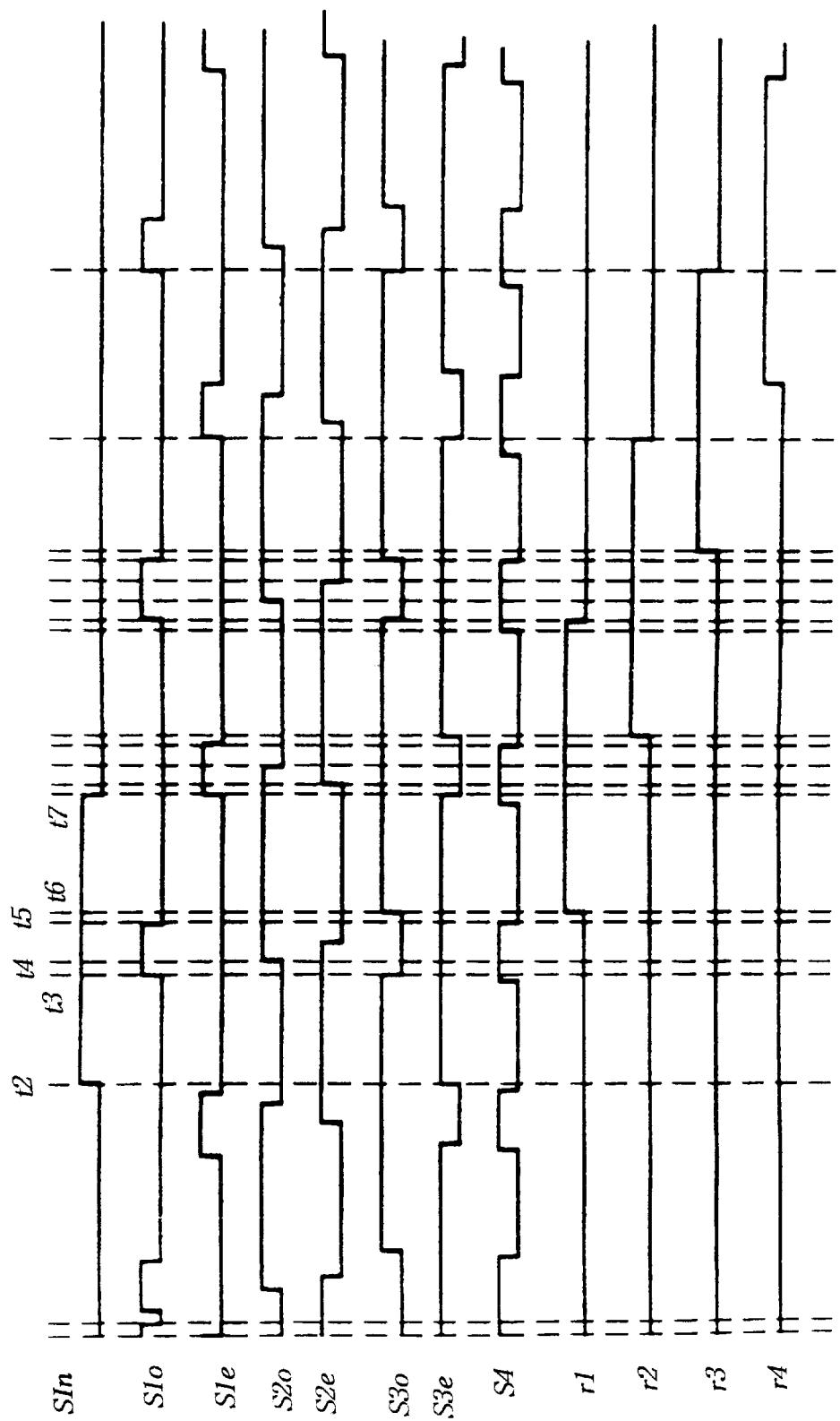
FIG. 3 shows the waveform chart for the scan driver IC of FIG. 1.
Figure 4:
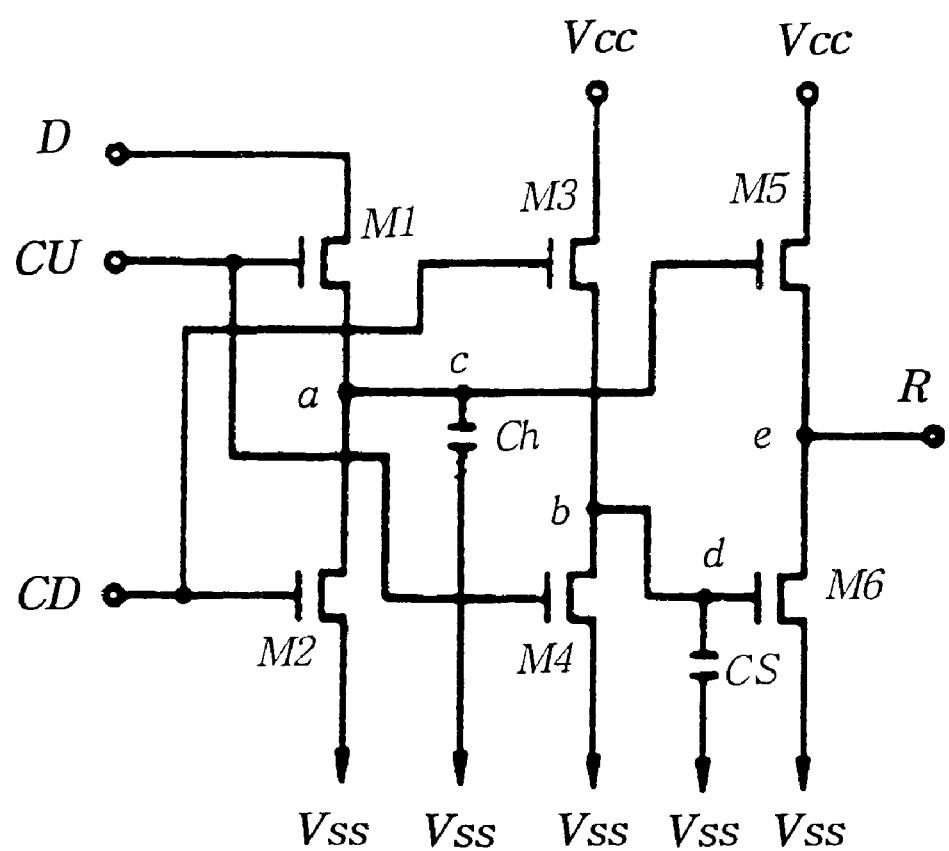
FIG. 4 shows an example of a row selector in a scan driver IC according to an embodiment of Applicant's co-pending application as recited in the Discussion of the Related Art.
Figure 5:
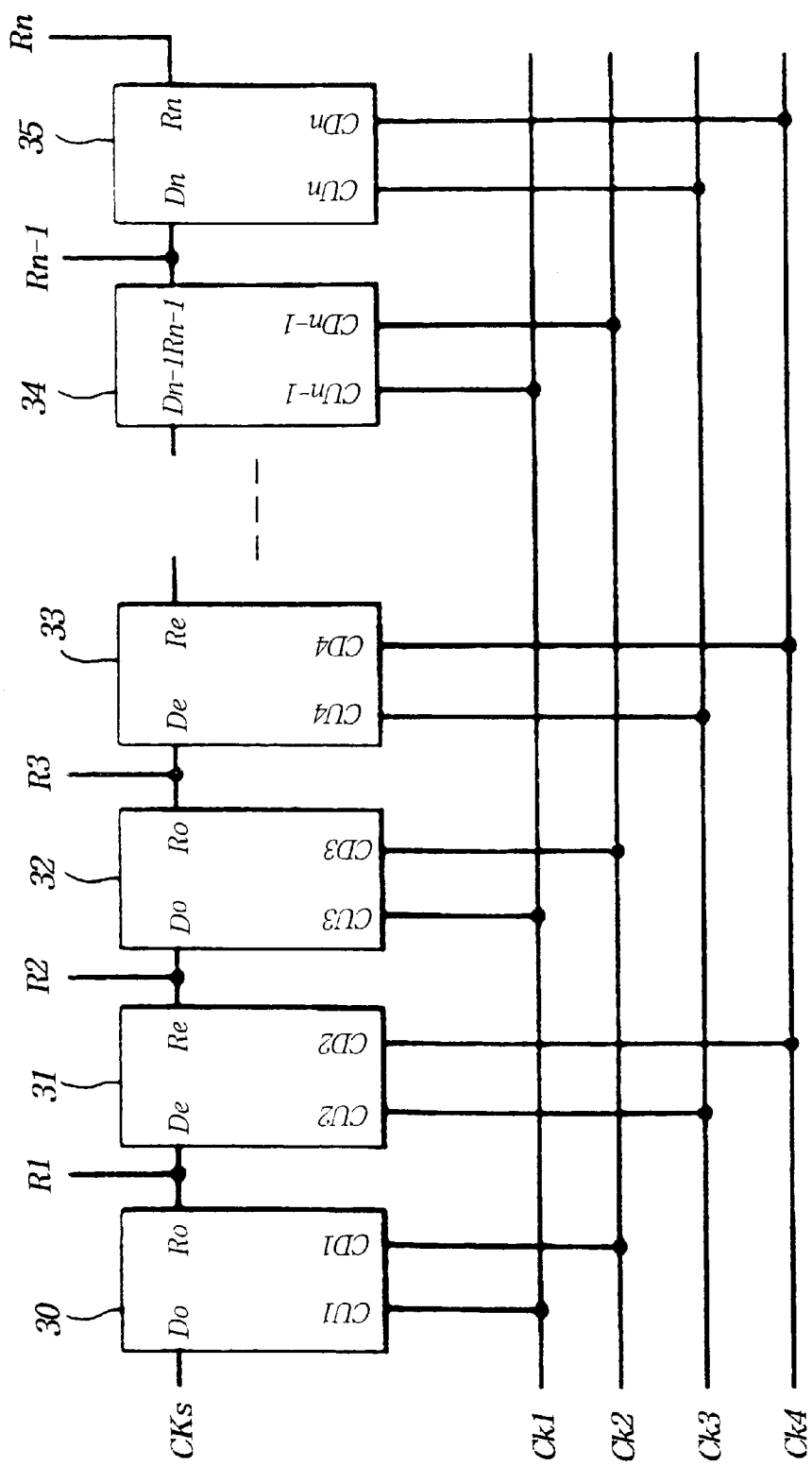
FIG. 5 shows the structure of the scan driver IC in which the row selectors of FIG. 4 are serially connected.
Figure 6:
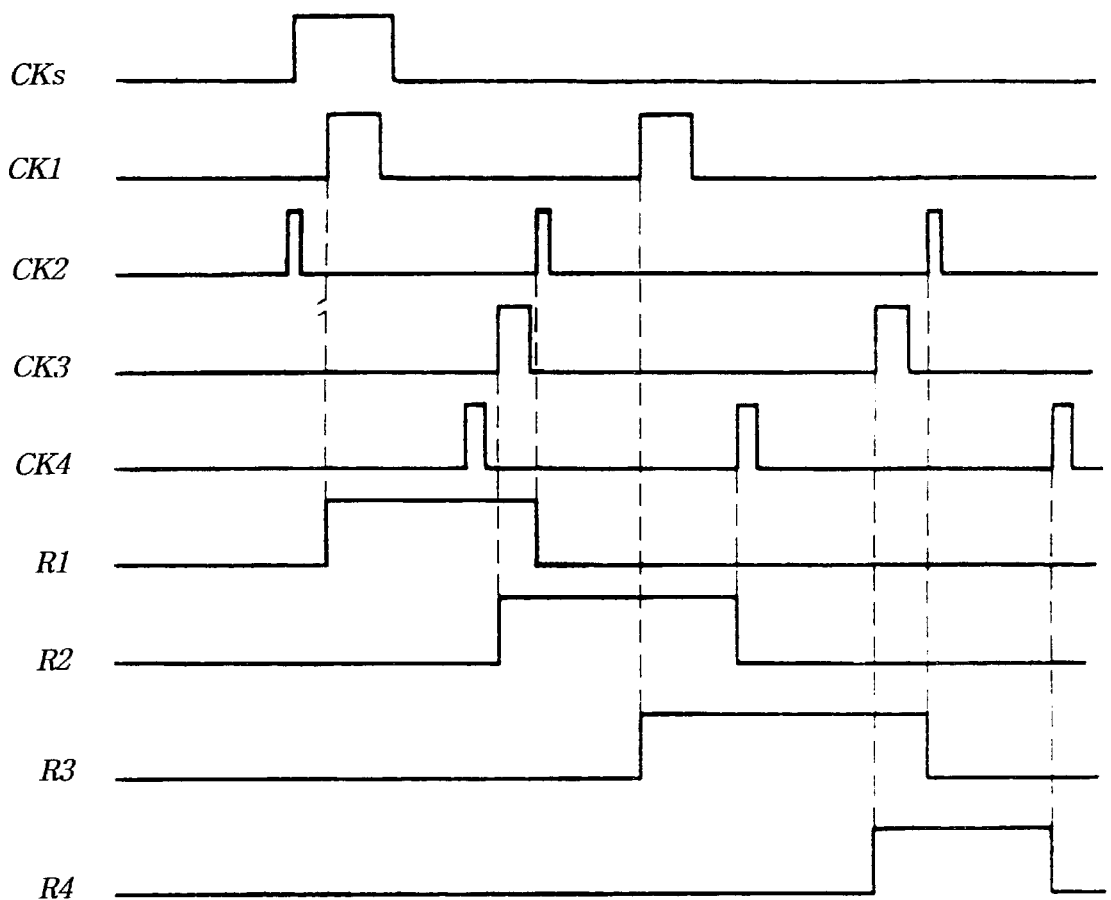
FIG. 6 shows the waveform chart for the scan driver IC of FIG. 5.
Figure 7:
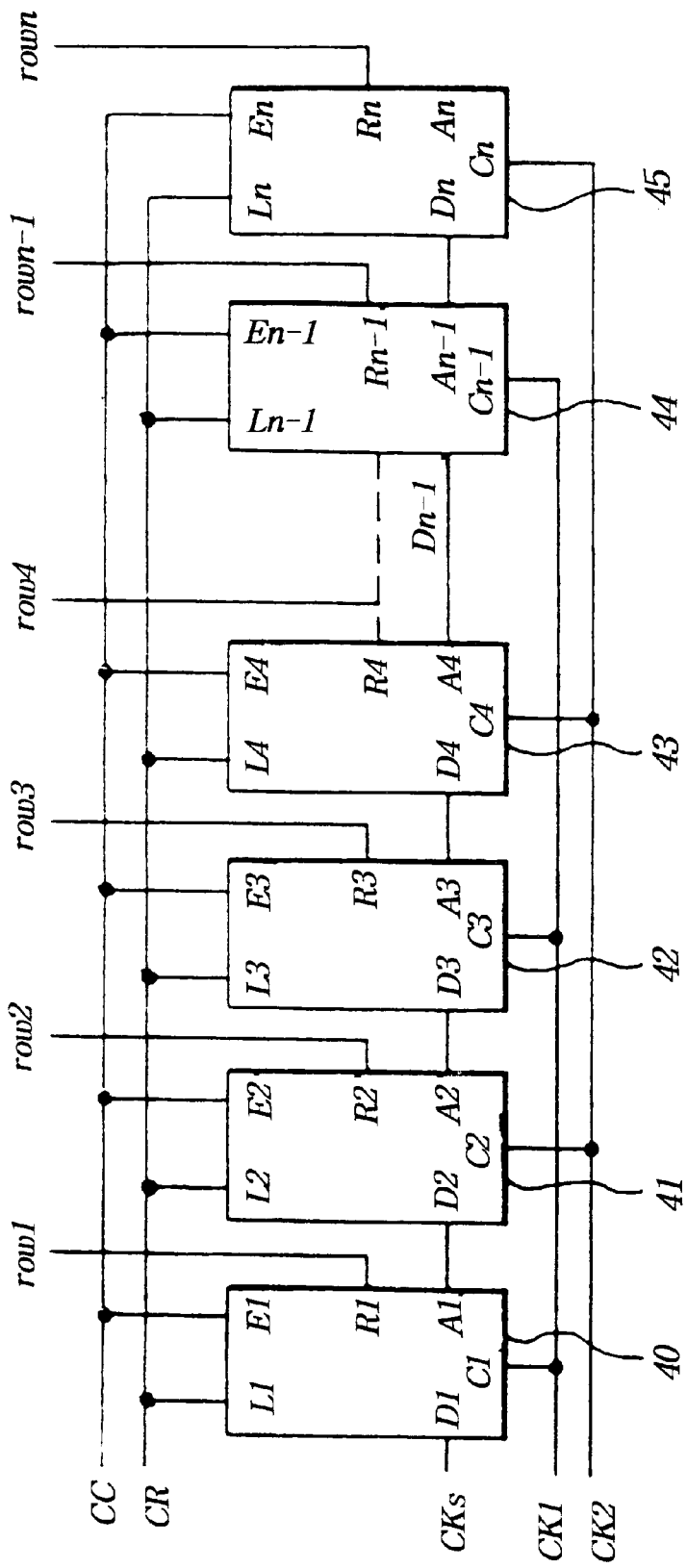
FIG. 7 shows the structure of the scan driver IC including serially connected row selectors according to a first preferred embodiment of the present invention.

A scan driver IC according to a first preferred embodiment of the present invention has serially connected row selectors as shown in FIG. 7. Each row selector includes a shift input (D) terminal, a shift output (A) terminal, a shift reset (E) terminal, a set (C) terminal, a reset (L) terminal and an output (R) terminal. These row selectors are connected in series by connecting the shift output (A) terminal to the shift input (D) terminal of the next row selector in the scan driver IC.

Figure 8:
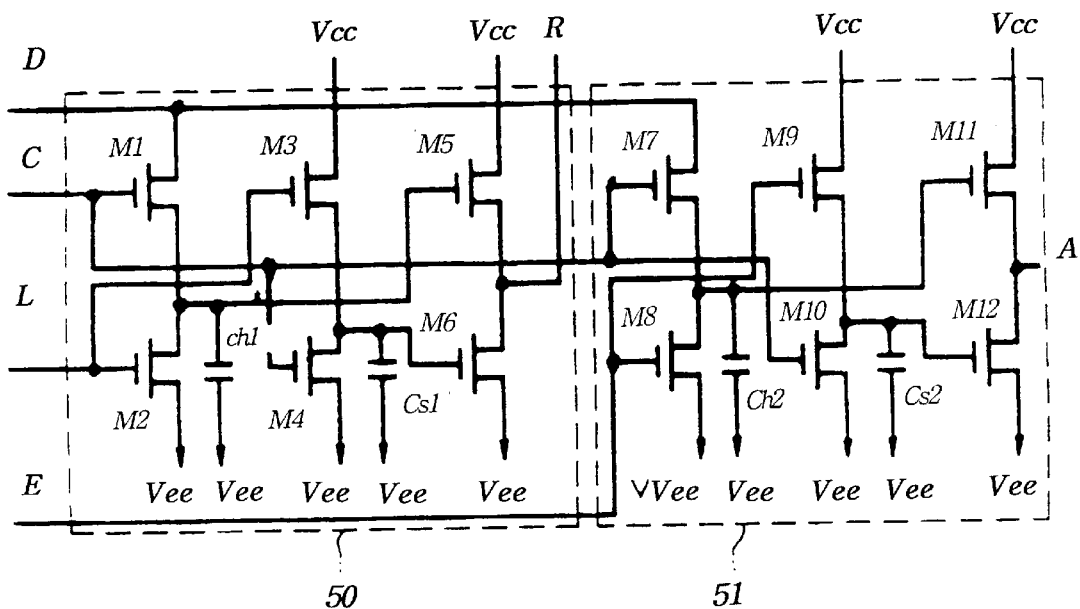
FIG. 8 shows an example of a row selector according to the first preferred embodiment of the present invention.

Each of the row selectors of the scan driver IC includes, as shown in FIG. 8, a first section 50 for generating and outputting a scan line selection signal and a second section 51 for generating and outputting a shift signal. The first section of each row selector includes an M1 transistor having a source connected to the shift input (D) terminal, and a gate connected to the set (C) terminal; an M2 transistor having a source connected to drain of the M1 transistor, a gate connected to the reset (L) terminal, and a drain connected to the common voltage Vee; an M3 transistor having a gate connected to the L terminal, and a source connected to "HIGH" voltage Vcc; an M4 transistor having a source connected to the drain of the M3 transistor, a gate connected to the C terminal and the gate of the M1 transistor, and a drain connected to the common voltage Vee; an M5 transistor having a gate connected to the drain of the M1 transistor and the source of the M2 transistor, and a source connected to Vcc; an M6 transistor having a gate connected to the drain of the M3 transistor and the source of the M4 transistor, a source connected to the drain of the M5 transistor, and a drain connected to the common voltage Vee; a Ch1 capacitor having one electrode connected to the drain of the M1 transistor and the source of the M2 transistor and the gate of the M5 transistor, another electrode of the Ch1 capacitor being connected to the Vee; a Cs1 capacitor having one electrode connected to the drain of the M3 transistor, the source of the M4 transistor, and to the gate of the M6 transistor, another electrode being connected to the common voltage Vee, wherein the output (R) terminal is connected to the drain of the M5 transistor and the source of the M6 transistor.

The second section 51 of each row selector includes an M7 transistor having a source connected to the shift input (D) terminal, and a gate connected to the set (C) terminal; an M8 transistor having a source connected to the drain of the M7 transistor, a gate connected to the shift reset (E) terminal, and a drain connected to the common voltage Vee; an M9 transistor having a gate connected to the E terminal, and a source connected to the "HIGH" voltage Vcc; an M10 transistor having a source connected to the drain of the M9 transistor, a gate connected to the C terminal and the gate of the M7 transistor, and a drain connected to the common voltage Vee; an M11 transistor having a gate connected to the drain of the M7 transistor and the source of the M8 transistor, and a source connected to the "HIGH" voltage Vcc; an M12 transistor having a gate connected to the drain of the M9 transistor and the source of the M10 transistor, a source connected to the drain of the M11 transistor, and a drain connected to the common voltage Vee; a Ch2 capacitor having one electrode connected to the drain of the M7 transistor, the source of the M8 transistor, and to the gate of the M11 transistor, and another electrode connected to the common voltage Vee; a Cs2 capacitor having one electrode connected to the drain of the M9 transistor, the source of the M10 transistor, and to the gate of the M12 transistor, another electrode being connected to the common voltage Vee; wherein the shift output (A) terminal is connected to the drain of the M11 transistor and the source of the M12 transistor.

A CK clock signal is applied to the set (C) terminal, a CR signal is applied to the reset (L) terminal, an A signal is applied to the shift input (D) terminal, and a CC signal is applied to the shift reset (E) terminal.

The scan driver IC of FIG. 7 includes a plurality of the row selectors described above serially connected. A CK1 clock signal is applied to the set terminal C of each of the odd-numbered row selectors, and a CK2 clock signal is applied to the set terminal C of each of the even-numbered row selectors. The CR signal is applied to the reset terminal L of each of the row selectors, and the CC signal is applied to the shift reset terminal E of each of the row selectors. A CKs signal, the initial shift signal, is applied to the shift input (D) terminal of the first row selector. The shift input (D) terminals of each of the subsequent row selectors is supplied with the shift output signal from the shift output (A) terminal of its preceding row selector.

Figure 9:
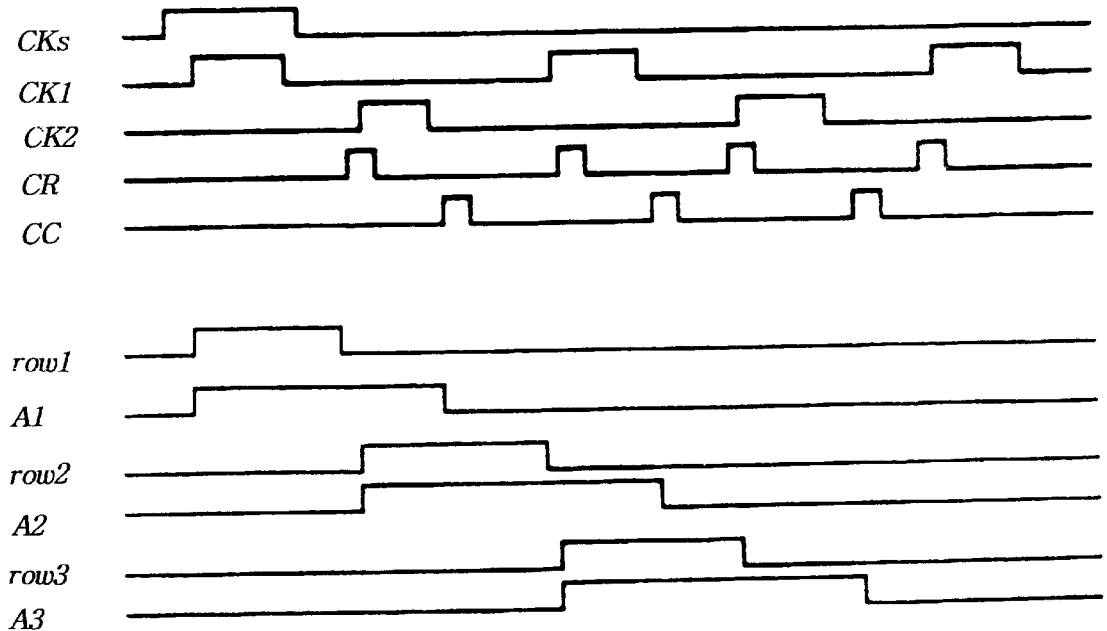
FIG. 9 shows the waveform chart for the scan driver IC including the row selector of FIG. 8.

The waveforms of the clocks are shown in FIG. 9. During the "HIGH" state of the CKs signal applied to the D terminal of the first row selector 40, a pulse signal is applied to the C1 terminal of the first row selector. Before a "HIGH" signal of the CK2 clock signal is applied to the C2 terminal of the second row selector 41, a "HIGH" signal of CR is applied to the L1 terminal of the first row selector 40.

Referring to the FIGS. 7, 8 and 9, the operation of the scan driver IC according to the present embodiment is explained. While a "HIGH" signal is applied to the CKs terminal of the first row selector, if the CK1 clock signal is "HIGH", then the transistors M1, M4, M7, and M10 are turned on. At this time, because the M2 and M8 transistors are turned off, the "HIGH" signal at the D1 terminal is applied to the gate of the M5 through the M1 transistor and to the gate of the M11 transistor through the M7 transistor. Thus, the M5 and M11 transistors are turned on. At the same time, this "HIGH" signal is stored at the Ch1 and Ch2 capacitors. Additionally, because the M6 and M12 transistors are turned off, the "HIGH" voltage Vcc is applied to the R1 terminal through the M5 transistor and to the A1 terminal through the M11 transistor. Hence, the first scan line connected to the output (R1) terminal of the first row selector 40 is selected.

When the clock signal CK1 becomes "LOW", the M1 and M7 transistors are turned off. Then, the Ch1 and Ch2 capacitors begin to discharge. Because the M1, M2, M7 and M8 transistors are turned off, the discharging voltage from the Ch1 capacitor is applied to the gate of the M5 transistor and the discharging voltage from the Ch2 capacitor is applied to the gate of the M11 transistor. As a result, the M5 transistor is still being turned on while the CK1 clock signal is "LOW", and the R1 output terminal outputs a "HIGH" signal. Similarly, the M11 transistor is also turned on, so the A1 terminal also outputs a "HIGH" signal. The "HIGH" signal output from the shift output A1 terminal of the first row selector 40 is applied to the shift input terminal D2 of the second row selector 41 as a shift input signal, during the period that the CK2 clock signal is "HIGH".

If a "HIGH" signal is applied to the shift input terminal D2 of the second row selector 41, then the second row selector 41 generates a selection signal selecting the second row (row2 in FIG. 7). Therefore, in order not to overlap the first row selection and the second row selection signals, the "HIGH" state of the R1 output terminal should be converted to a "LOW" state, before the CK2 clock signal is "HIGH". If before the CK2 clock signal is "HIGH", the CR signal is "HIGH", then the M6 transistor is turned on because the M2 and M3 transistors are turned on. So, the Vcc applied to the M5 transistor is passed out through the M6 transistor. Therefore, the R1 terminal outputs a "LOW" signal. Hence, the first scan line is unselected. However, the A1 terminal is still in an "ON" state, and the shift signal is applied to the second row selector 41.

Before the CR signal is low, the CK2 clock signal is "HIGH". Thus, the second row selector 41 generates a selection signal using the shift signal from the shift output terminal A1 of the first row selector 40 according the same process with the first row selector 40. Even when the CK2 clock signal becomes "LOW", the Ch1 capacitor of the second row selector 41 turns on the M5 transistor. Thus, the R2 and A2 terminals of the second row selector 41 are still "HIGH". When the CR signal becomes "LOW", the M2, M3, M1, M4 and M5 transistors of the first row selector 40 are turned off, but the R1 output terminal of the first row selector 40 maintains its "LOW" state.

After the CK2 clock signal is low, the CC signal becomes "HIGH". At this time, the M8 and M9 transistors of the first row selector 40 are turned on. Thus, the M11 transistor is turned off, because its gate is not supplied with a "HIGH" signal. On the other hand, the high voltage Vcc is applied to the gate of the M12 transistor and capacitor Cs2. Therefore, the M12 transistor is turned on and the common voltage Vee ("LOW") is applied to the shift output terminal A1. This shift output terminal A1 of the first row selector 40 is thus inactivated. When the CC signal becomes low, the M8 and M9 transistors are turned off. However, the M12 is still being turned on, because the stored voltage in the Cs2 is applied to the gate of the transistor M12. That is, the terminal A1 of the first row selector maintains it's "LOW" state.

Before the CK2 clock signal becomes "HIGH" again in the second row selector 41, the second row selector 41 is applied a "HIGH" CR signal at the L2 reset terminal. Then, the M2 and the M3 transistors of the second row selector 41 are turned on, and accordingly the M6 transistor is turned on. Therefore, the Vcc signal applied to the M5 transistor passes through the M6 transistor, and the R2 output terminal outputs a "LOW" signal. However, the shift output terminal A2 is still outputting the "HIGH" signal. Hence, the second scan line is unselected and the shift input terminal D3 of the third row selector 42 is supplied with the "HIGH" shift signal from the shift output terminal A2 of the second row selector 41.

When the CK1 clock is high in the third row selector 42, the third row selector 41 begins to operate according to a similar process as the first row selector 40. After the CK2 clock signal becomes "LOW" in the second row selector 41, the CC signal becomes "HIGH" in the second row selector 41. Then, the A2 of the second row selector is "LOW". Accordingly, each "HIGH" signal of the CC signal is used to change the A signal from "HIGH" to "LOW".

According to this embodiment, the circuit structures for circuits generating the output signal and the shift signal in a row selector are same, and the clock signals applied to the set terminal is also the same. However, using the different clock signals for the reset terminals, the output signal for scan line selection and the shift signal for enabling the next row selector are controlled individually. Therefore, this first preferred embodiment presents the scan driver IC applying the more exact signal for the scan line selection and superior controlability.

Second Preferred Embodiment

Another example of the scan driver IC of the present invention employs a similar type of row selector to the first preferred embodiment, but with a different connecting method for connecting together the respective row selectors. In this second preferred embodiment of the present invention, shown in FIG. 10, the shift reset terminal (E) of each of the row selectors is connected to the output terminal (R) of the subsequently connected row selector in the scan driver IC. As a result, the CC supply line for supplying the shift reset signal to the E terminal of each row selector is not needed in this second embodiment.

Figure 10:
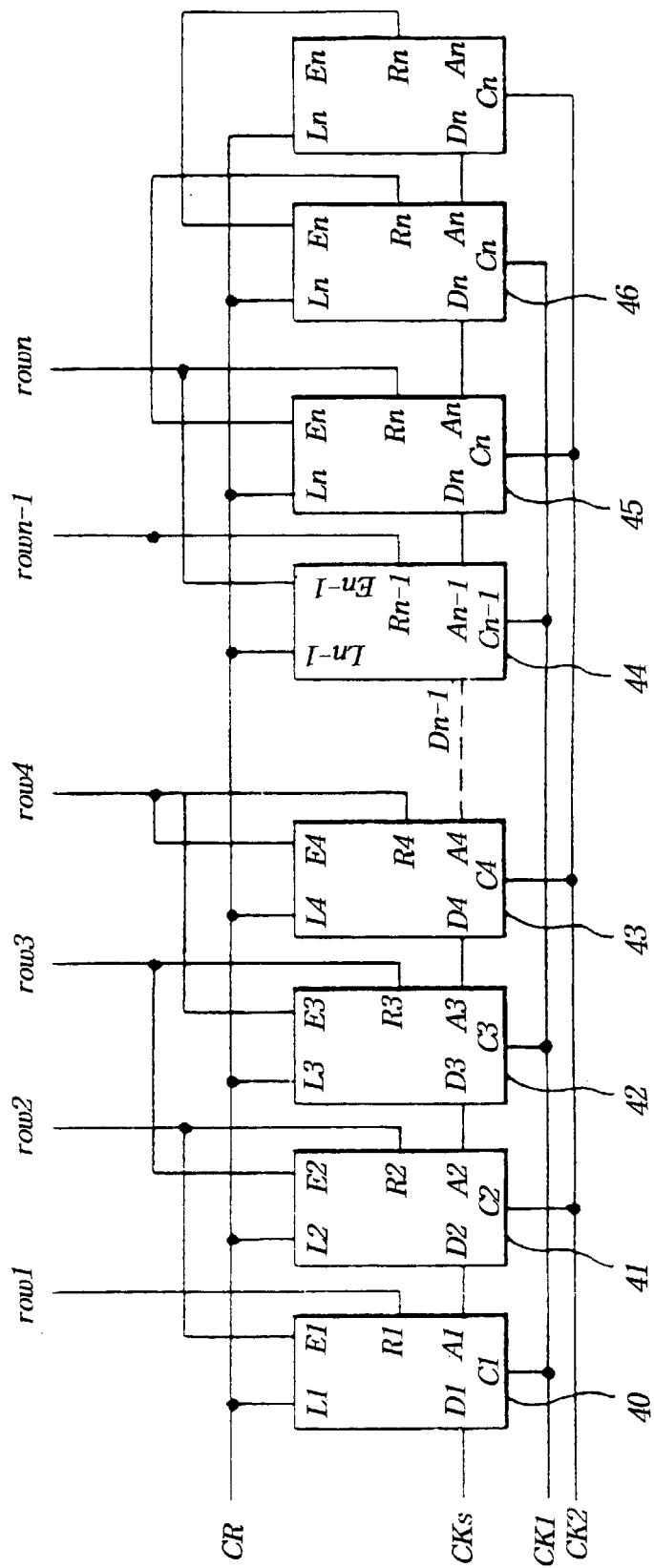
FIG. 10 shows the structure of a scan driver IC including serially connected row selectors according to a second preferred embodiment of the present invention.
Figure 11:
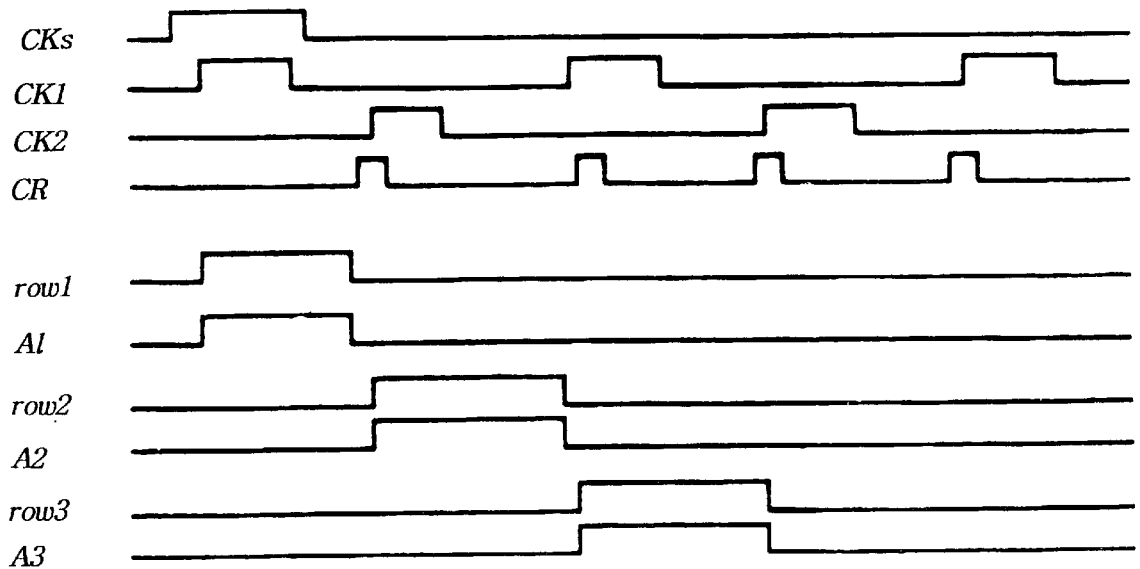
FIG. 11 shows the waveform chart for the scan driver IC of FIG. 10.

FIG. 11 shows the waveform chart, including the clock signals, for the scan driver IC of FIG. 10. The operation of this embodiment is similar to the operation of the first preferred embodiment of the present invention. In this embodiment, when the CK2 clock signal is "HIGH", the output signal applied to the second row is "HIGH", and that "HIGH" signal is applied to the shift reset terminal of the first row selector. Therefore, the shift signal output from terminal A1 of the first row selector becomes "LOW". Consequently, when the (n+1)th scan line is selected, the shift signal of the n th row selector is inactivated.

Comparing the waveforms of this embodiment with those of the first preferred embodiment, the input clock signal and the output signal are the same, but the shift signal is the same as the output signal. Because the shift signal is not overlapped with the output signal, the transistors in the scan driver IC have a lower load than in the first preferred embodiment.

Referring to the first and second preferred embodiments above, the structure of the scan driver IC is simpler than that of the conventional art. Moreover, the elements of the scan driver IC include TFTs and capacitors, composed of the same material as the TFT array. Therefore, the scan driver IC can be manufactured by the same process for manufacturing the TFT array, and accordingly integrally formed on the same substrate.

In manufacturing the LCD panel having the scan driver IC and the TFT array on the same substrate, if an error occurs in the scan driver IC, then the whole LCD panel can not be used. The following embodiments present solutions to such a problem, which may be generated when the scan driver IC is manufactured on the same substrate as the TFT array.

Third Preferred Embodiment

A third preferred embodiment according to the present invention includes a TFT array on a substrate, a plurality of scan driver ICs on the substrate, and a plurality of switching elements whose switching electrodes are commonly connected. Each of the switching elements connects the output terminal of the scan driver IC to the scan line of the TFT array. Moreover, at each scan line, the two or more output terminals of the scan driver ICs are connected in parallel. Thus, if one of the output terminals of the scan driver IC has an error, then that terminal can be cut off by the switching element connected to it. The output signal can then be applied to the scan line through the other output terminal.

Figure 12:
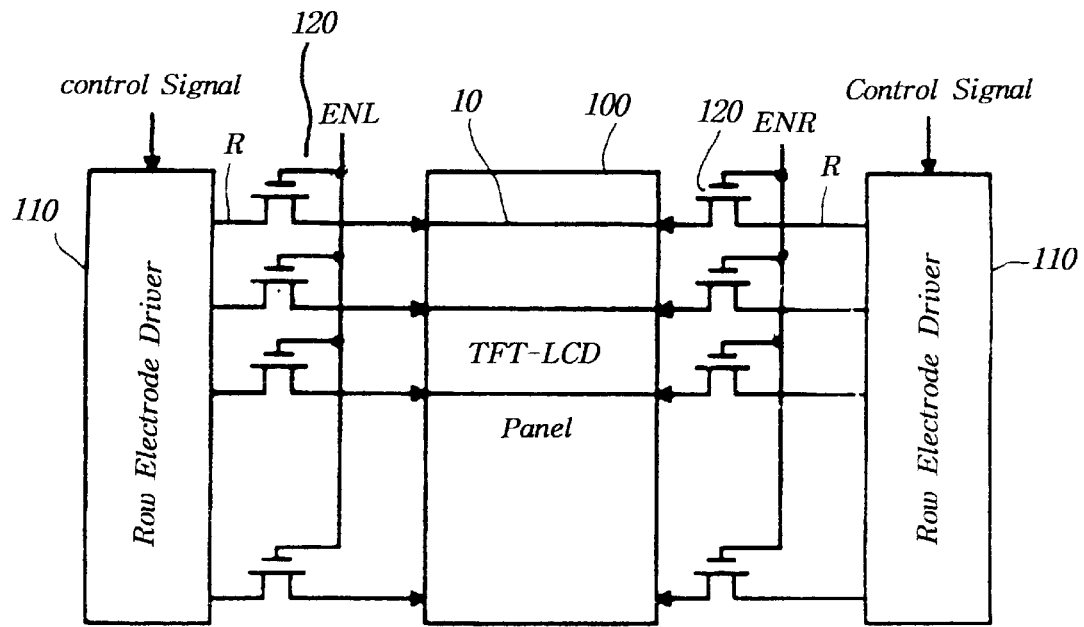
FIG. 12 shows an example of the structure of the liquid crystal display device having a plurality of scan driver ICs and switching elements according to a third preferred embodiment of the present invention.

Referring to FIG. 12, the present embodiment will be explained in detail. A TFT array 100 is manufactured on a substrate, and the scan driver IC including TFTs, as described in the first and second embodiments, is formed on the same substrate. Here, at both sides of the TFT array, two scan driver ICs 110 are formed. A plurality of TFTs 120 as switching elements are formed between the TFT array 100 and each scan driver IC 110. The scan lines are connected to the drains (or sources) of the switching elements 120, and the output terminals of the scan driver ICs are connected to the sources (or drains) of the switching elements 120. One scan line 10 is connected to the two scan driver ICs through the two switching elements. The gates of switching elements 120 on one side (the right side of the TFT array) are commonly connected to an ENR terminal. Also, the gates of switching elements 120 in the other side (the left side of the TFT array) are commonly connected to an ENL terminal.

Consequently, one scan line has two scan driver ICs, one at each end. Once the LCD panel is completely manufactured, if at the testing process, one of the driver ICs has an error, then that one may be disconnected by switching elements 120. The other scan driver IC remains connected to drive the scan line.

Fourth Preferred Embodiment

Figure 13:
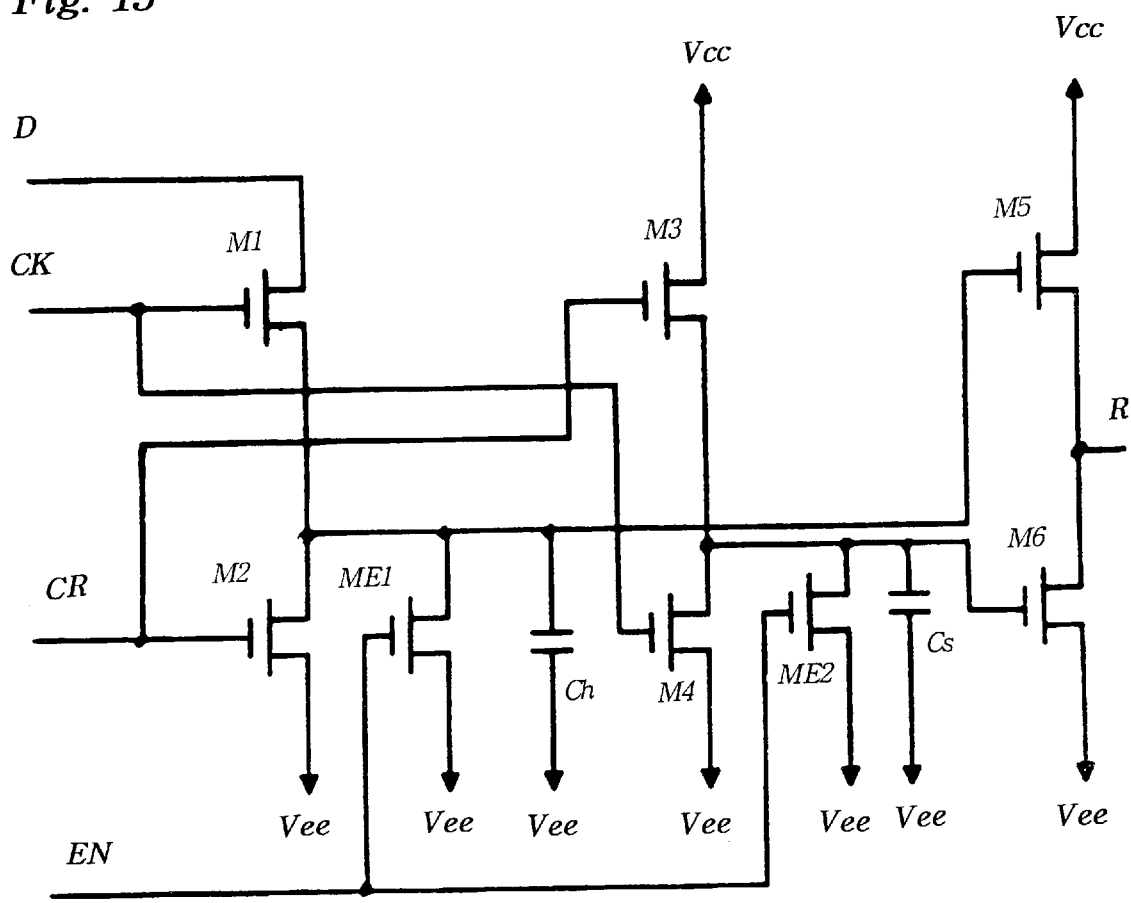
FIG. 13 shows an example of a row selector for the scan driver IC according to a fourth preferred embodiment of the present invention.

In the above described third preferred embodiment, the switching elements are formed outside the scan driver IC. A fourth preferred embodiment of the present invention, on the other hand, presents a structure in which the scan driver IC has the switching elements incorporated therein, as shown in FIG. 13.

This embodiment includes a plurality of row selectors. The driver IC includes a CK input terminal for receiving a set signal. A CR input terminal is provided for receiving a reset signal. An R output terminal is provided for applying a driving signal to the scan line. A D input terminal is provided for receiving a shift signal. This fourth embodiment further includes ME1 and ME2 transistors, each having gates connecting to an EN input terminal. Here, if a row selector malfunctions, then that particular row selector can be deactivated by applying a "HIGH" signal to the EN input terminal.

The third preferred embodiment has a TFT for switching the scan signal. Thus, there is a small voltage drop in the scan line according to the resistance of the TFT used as a switching element. As a result, the driving voltage should be large enough to maintain the driving level. The fourth preferred embodiment has two TFTs for activating the row selector. That is, the switching elements ME1 and ME2 control the scan driving signal itself. When a scan driver on the LCD panel, having a TFT array and scan driver ICs, malfunctions, the malfunctioning scan driver IC can be deactivated by applying a "HIGH" signal to the EN terminal. Thus, there is no voltage distortion in the scan signal.

According to the present invention, the structure of the scan driver IC is improved over prior art arrangements for at least the following reasons. The scan driver IC of the present invention includes a first portion for generating the scan line selection signal and a second portion for separately generating the shift signal. As a result, the scan line selection signals can be controlled by the designer of the liquid crystal display device. For example, the scan line selection signals can be designed to overlap each other for an LCD having switching elements with a low response speed. Alternatively, the scan line selection signals can be designed not to overlap each other for an LCD having switching elements with a lower electrical load.

Moreover, the structure of the scan driver IC is simplified in comparison with prior art arrangements for at least the following reasons. First, the number of transistors required in the arrangement is less than that of the conventional art. Furthermore, the number of terminals is less than that of conventional art. Thus, it is simpler to connect the scan driver IC according to the present invention to the TFT array.

According to the second preferred embodiment, the scan driver IC does not require a separate CC shift reset signal supply line, thus obviating the need for providing such a shift reset signal supply line CC.

Additionally, the material of the scan driver IC can be amorphous silicon or polysilicon. Therefore, the scan driver IC can be manufactured with the TFT array at the same time on the same substrate, resulting in reduced costs and the higher production yield.

It will be apparent to those skilled in the art that various modifications and variations can be made in the scan driver IC for a liquid crystal display of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a substrate;
   a plurality of scan lines on the substrate; and
   a scan driver IC on the substrate having a plurality of scan line selectors, each scan line selector including:
   a first input terminal for receiving a set signal,
   a second input terminal for receiving a scan reset signal,
   a shift input terminal for receiving a shift signal,
   a shift reset terminal for receiving a shift reset signal,
   a first output terminal connected respectively to one of the plurality of scan lines for outputting a scan line selection signal in accordance with the set signal and the scan reset signal, and
   a shift output terminal for outputting a shift signal in accordance with the set signal and the shift reset signal, wherein each scan line selector is arranged so that the scan line selection signal and the shift signal are separately generated and are able to be controlled individually.

2. The liquid crystal display device according to claim 1, wherein each of the scan line selectors of the scan driver IC further comprises:
   a first section for generating the scan line selection signal including:
   a first transistor having a gate, a source, and a drain, the gate being connected to the first input terminal, and the source being connected to the shift input terminal,
   a second transistor having a gate, a source, and a drain, the gate being connected to the second input terminal, the source being connected to the drain of the first transistor, and the drain being connected to a common voltage Vee;
   a third transistor having a gate, a source, and a drain, the gate being connected to the second input terminal and the source being connected to a HIGH voltage Vcc;
   a fourth transistor having a gate, a source and a drain, the gate being connected to the first input terminal, the source being connected to the drain of the third transistor, and the drain being connected to the common voltage Vss;
   a fifth transistor having a gate, a source and a drain, the gate being connected to the drain of the first transistor and the source of the second transistor, and the source being connected to the HIGH voltage Vcc;
   a sixth transistor having a gate, a source and a drain, the gate being connected to the drain of the third transistor and the source of the fourth transistor, the source being connected to the drain of the fifth transistor, and the drain being connected to the common voltage Vss;
   a first capacitor having a first electrode connected to the common voltage Vee, and a second electrode connected to the gate of the fifth transistor, the drain of the first transistor, and to the source of the second transistor, and
   a second capacitor having a first electrode connected to the common voltage Vee, and a second electrode connected to the gate of the sixth transistor, the drain of the third transistor, and to the source of the fourth transistor,
   wherein the first output terminal is connected to the drain of the fifth transistor and the source of the sixth transistor; and
   a second section for generating the shift signal including:
   a seventh transistor having a gate, a source, and a drain, the gate being connected to the first input terminal, and the source being connected to the shift input terminal;
   an eighth transistor having a gate, a source, and a drain, the gate being connected to the shift reset terminal, the source being connected to the drain of the seventh transistor, and the drain being connected to a common voltage Vee;
   a ninth transistor having a gate, a source, and a drain, the gate being connected to the shift reset terminal and the source being connected to the HIGH voltage Vcc;
   a tenth transistor having a gate, a source and a drain, the gate being connected to the first input terminal, the source being connected to the drain of the ninth transistor, and the drain connecting to the common voltage Vee;
   an eleventh transistor having a gate, a source and a drain, the gate being connected to the drain of the seventh transistor and the source of the eighth transistor, and the source being connected to the high voltage Vcc;
   a twelfth transistor having a gate, a source and a drain, the gate being connected to the drain of the ninth transistor and the source of the tenth transistor, the source being connected to the drain of the eleventh transistor, and the drain being connected to the common voltage Vee,
   a third capacitor having a first electrode connected to the common voltage Vee, and a second electrode connected to the gate of the eleventh transistor, the drain of the seventh transistor, and to the source of the eighth transistor, and
   a fourth capacitor having a first electrode connected to the common voltage Vee, and a second electrode connected to the gate of the twelfth transistor, the drain of the ninth transistor, and the source of the tenth transistor,
   wherein the shift output terminal is connected to the drain of the eleventh transistor and the source of the twelfth transistor.

3. The liquid crystal display device according to claim 2, wherein each scan line selector further comprises:
   a control terminal for receiving an enable signal;
   a first switching transistor having a gate connected to the control terminal, a drain connected to the common voltage Vee, and a source connected to the drain of the first transistor and the source of the second transistor; and
   a second switching transistor having a gate connected to the control terminal, a drain connected to the common voltage Vee, and a source connected to the drain of the third transistor and the source of the fourth transistor.

4. The liquid crystal display device according to claim 1, further comprising:
   a plurality of data lines on the substrate crossing the plurality of scan lines;
   a pixel electrode at each of the scan and data line intersections on the substrate; and
   a plurality of thin film transistors, each having a gate connected to one of the plurality of scan lines, a source connected to one of the plurality of data lines, and a drain connected to an adjacent one of the pixel electrodes, wherein the thin film transistors and said scan driver IC are simultaneously and integrally formed on the substrate.

5. The liquid crystal display device according to claim 1, wherein the shift reset terminal of the nth scan line selector is connected to the first output terminal of the (n+1)th scan line selector.

6. The liquid crystal display device according to claim 1, further comprising:
a plurality of first switching elements each connected to a first end of the respective one of the scan lines;
a plurality of second switching elements, each connected to a second end of the respective one of the scan lines; and
at least one additional scan driver IC on the substrate having a plurality of scan line selectors, each scan line selector including:
a first input terminal for receiving a set signal,
a second input terminal for receiving a reset signal,
a shift input terminal for receiving a shift signal,
a shift reset terminal for receiving a shift reset signal,
a first output terminal connected respectively to one of the plurality of scan lines for outputting a scan line selection signal in accordance with the set signal and the scan reset signal, which are input to the scan line selector of the at least one additional scan driver IC, and
a shift output terminal for outputting a shift signal, in accordance with the set signal and the shift reset signal, which are input to the scan line selector of the at least one additional scan driver IC,
wherein each of the first output terminals of the scan driver IC is connected to the respective one of the first switching elements, and each of the first output terminals of the at least one addition scan driver IC is connected to the respective one of the second switching elements.

7. The liquid crystal display, according to claim 6, wherein each of the first and second switching elements includes a thin film transistor having:
a gate for receiving an enable signal;
a source connected to the respective output terminal of one of the scan driver ICs; and
a drain connected to the corresponding end of the scan line.

8. A scan driver IC having a plurality of scan line selectors, each of the scan line selectors comprising:
a first input terminal for receiving a set signal;
a second input terminal for receiving a scan reset signal;
a shift input terminal for receiving a shift signal;
a shift reset terminal for receiving a shift reset signal;
a first output terminal for outputting a scan line selection signal in accordance with the set signal and the scan reset signal; and
a shift output terminal for outputting a shift signal in accordance with the set signal and the shift reset signal, wherein each scan line selector is arranged so that the scan line selection signal and the shift signal are separately generated and are able to be controlled individually.

9. The scan driver IC according to claim 8, wherein each of the scan line selectors further comprises:
a first section for generating the scan line selection signal comprising:
a first transistor having a gate, a source, and a drain, the gate being connected to the first input terminal, and the source being connected to the shift input terminal, a second transistor having a gate, a source, and a drain, the gate being connected to the second input terminal, the source being connected to the drain of the first transistor, and the drain being connected to a common voltage Vee,
a third transistor having a gate, a source, and a drain, the gate being connected to the second input terminal and the source being connected to a HIGH voltage Vcc,
a fourth transistor having a gate, a source and a drain, the gate being connected to the first input terminal, the source being connected to the drain of the third transistor, and the drain being connected to the common voltage Vss,
a fifth transistor having a gate, a source and a drain, the gate being connected to the drain of the first transistor and the source of the second transistor, and the source being connected to the HIGH voltage Vcc,
a sixth transistor having a gate, a source and a drain, the gate being connected to the drain of the third transistor and the source of the fourth transistor, the source being connected to the drain of the fifth transistor, and the drain being connected to common voltage Vss,
a first capacitor having a first electrode connected to the common voltage Vee, and a second electrode connected to the gate of the fifth transistor, the drain of the first transistor, and to the source of the second transistor, and
a second capacitor having a first electrode connected to the common voltage Vee, and a second electrode connected to the gate of the sixth transistor, the drain of the third transistor, and to the source of the fourth transistor,
wherein the first output terminal is connected to the drain of the fifth transistor and the source of the sixth transistor, and
a second section for generating the shift signal including:
a seventh transistor having a gate, a source, and a drain, the gate being connected to the first input terminal, and the source being connected to the shift input terminal,
an eighth transistor having a gate, a source, and a drain, the gate being connected to the shift reset terminal, the source being connected to the drain of the seventh transistor, and the drain being connected to a common voltage Vee,
a ninth transistor having a gate, a source, and a drain, the gate being connected to the shift reset terminal and the source being connected to the HIGH voltage Vcc,
a tenth transistor having a gate, a source and a drain, the gate being connected to the first input terminal, the source being connected to the drain of the ninth transistor, and the drain being connected to the common voltage Vee,
an eleventh transistor having a gate, a source and a drain, the gate being connected to the drain of the seventh transistor and the source of the eighth transistor, and the source being connected to the high voltage Vcc,
a twelfth transistor having a gate, a source and a drain, the gate being connected to the drain of the ninth transistor and the source of the tenth transistor, the source being connected to the drain of the eleventh transistor, and the drain being connected to the common voltage Vee, a third capacitor having a first electrode connected to the common voltage Vee, and a second electrode connected to the gate of the eleventh transistor, the drain of the seventh transistor, and to the source of the eighth transistor, and a fourth capacitor having a first electrode connected to the common voltage Vee, and a second electrode connected to the gate of the twelfth transistor, the drain of the ninth transistor, and the source of the tenth transistor, wherein the shift output terminal is connected to the drain of the eleventh transistor and the source of the twelfth transistor.

10. The scan driver IC according to claim 8, wherein the shift reset terminal of the nth scan line selector is connected to the first output terminal of the (n+1)th scan line selector.

11. The scan driver IC according to claim 9, wherein each scan line selector further comprises:

a control terminal for receiving an enable signal;

a first switching transistor having a gate connected to the control terminal, a drain connected to the common voltage Vee, and a source connected to the drain of the first transistor and the source of the second transistor; and a second switching transistor having a gate connected to the control terminal, a drain connected to the common voltage Vee, and a source connected to the drain of the third transistor and the source of the fourth transistor.

12. A scan driver for generating scan line selection signals for an active matrix liquid crystal display, the scan driver comprising:

a first set bus line for transmitting a first set clock signal;

a second set bus line for transmitting a second set clock signal;

a scan reset bus line for transmitting a scan reset clock signal;

a shift reset bus line for transmitting a shift reset clock signal; and a plurality of scan line selectors disposed in a row and numbered consecutively from 1 to N with N being a positive integer for identification, each of the plurality of scan line selectors including:

a shift clock input terminal for receiving a shift clock signal, a set terminal connected to one of the first and second set bus lines for receiving the corresponding set clock signal, the set terminals of the odd-numbered scan line selectors being connected to the first set bus line, the set terminals of the even-numbered scan line selectors being connected to the second set bus line, a scan reset terminal connected to the scan reset bus line for receiving the scan reset clock signal, a shift reset terminal connected to the shift reset bus line for receiving the shift reset clock signal, a scan output terminal for outputting a scan line selection signal, and a shift output terminal connected to the shift clock input terminal of the next scan line selector for outputting the shift clock signal for the next scan line selector, wherein each of the plurality of scan line selectors processes the received set clock signal and the scan reset clock signal in accordance with the received shift clock signal to output the scan line selection signal, and wherein each of the plurality of scan line selectors processes the received set clock signal and the shift reset clock signal in accordance with the received shift clock signal to output the shift clock signal for the next scan line selector, and wherein each of the plurality of scan line selectors is arranged so that the scan line selection signal and the shift clock signal are separately generated and are able to be controlled individually.

13. The scan driver according to claim 12, wherein each of the plurality of scan line selectors determines the pulse width of the scan line selection signal by a leading edge of the pulse of the received set clock signal and a leading edge of the pulse of the scan reset clock signal, and wherein each of the plurality of scan line selectors determines the pulse width of the output shift clock signal by the leading edge of the pulse of the received set clock signal and a leading edge of the pulse of the scan reset clock signal.

14. The scan driver according to claim 12, wherein the plurality of scan line selectors output the scan line selection signals that are separated from each other in time, whereas each of the scan line selectors outputs the shift clock signals that overlaps the shift clock signal outputted from the next scan line selector.

* * * * *